United States Patent
Smith et al.

(10) Patent No.: US 8,822,815 B2
(45) Date of Patent: Sep. 2, 2014

(54) PHOTOVOLTAIC SILICON SOLAR CELLS

(75) Inventors: Joseph Terence Smith, Columbia, MD (US); Patrick Bruckner Shea, Washington, DC (US); Dennis Allen Adams, Gambrills, MD (US); Marvin Hart White, Bethlehem, PA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 1386 days.

(21) Appl. No.: 12/585,500

(22) Filed: Sep. 16, 2009

(65) Prior Publication Data

US 2010/0108138 A1    May 6, 2010

Related U.S. Application Data

(60) Provisional application No. 61/193,194, filed on Nov. 4, 2008.

(51) Int. Cl.
- *H01L 31/02* (2006.01)
- *H01L 27/142* (2014.01)
- *H01L 31/068* (2012.01)
- *H01L 31/0216* (2014.01)
- *H01L 31/18* (2006.01)

(52) U.S. Cl.
CPC ........ *H01L 31/02167* (2013.01); *H01L 27/142* (2013.01); *Y02E 10/547* (2013.01); *H01L 31/068* (2013.01); *H01L 31/1804* (2013.01)
USPC .............. 136/256; 136/252; 438/57; 438/591

(58) Field of Classification Search
USPC ............................. 136/256, 252; 438/57, 591
See application file for complete search history.

(56) References Cited

U.S. PATENT DOCUMENTS

| | | | | |
|---|---|---|---|---|
| 4,107,724 A | * | 8/1978 | Ralph | 257/43 |
| 4,253,881 A | * | 3/1981 | Hezel | 136/256 |
| 4,994,879 A | * | 2/1991 | Hayashi | 257/432 |
| 5,529,946 A | * | 6/1996 | Hong | 438/253 |
| 6,784,933 B1 | * | 8/2004 | Nakai | 348/302 |
| 7,023,739 B2 | * | 4/2006 | Chen et al. | 365/185.28 |
| 8,163,591 B2 | * | 4/2012 | Park et al. | 438/72 |
| 8,188,361 B2 | * | 5/2012 | Huang | 136/244 |
| 2008/0202577 A1 | * | 8/2008 | Hieslmair | 136/244 |

* cited by examiner

*Primary Examiner* — Golam Mowla

(74) *Attorney, Agent, or Firm* — Andrews Kurth LLP; Sean S. Wooden; Matthew J. Esserman

(57) ABSTRACT

A photovoltaic semiconductor solar cell with a backside semiconductor-oxide-nitride-oxide nonvolatile charge storage structure (referred to as a "PHONOS solar cell") is disclosed. The PHONOS solar cell includes a semiconductor surface region, a semiconductor bulk region, and a backside structure that includes the SONO nonvolatile charge storage structure and a backside contact. The backside SONO nonvolatile charge storage structure greatly improves solar cell efficiency gains by eliminating "backside" losses, i.e., losses due to the recombination of photo-generated minority charge carriers created by the incident sunlight. The PHONOS solar cell is a highly efficient, ultra-thin, semiconductor solar cell that can be manufactured at low cost.

27 Claims, 8 Drawing Sheets

PHOTOVOLTAIC SILICON SOLAR CELLS

RELATED APPLICATION

This application claims the benefit of U.S. Provisional Application No. 61/193,194, filed on Nov. 4, 2008, which is hereby incorporated by reference in its entirety.

BACKGROUND

The global energy crisis has placed new demands for creative technologies to provide affordable and renewable energy to an increasing world population. In response to the increasing raw material price of silicon, silicon-based solar cell manufacturers have attempted to reduce the amount of polysilicon used per solar cell simply by thinning the wafers. However, as silicon solar cells are thinned to reduce manufacturing costs, internal reflection and especially backside surface carrier (electron) recombination-related efficiency losses increase rapidly and begin to dominate the performance of conventional silicon solar cells. As an example, thinning a silicon wafer from 300 um to 100 um reduces the sunlight to electricity conversion efficiency from 18.5% to 16.5% for a silicon solar cell constructed using a conventional aluminum Back Surface Field (BSF) due to backside surface recombination of photo-generated carriers. Hence, there is a need to reduce or eliminate backside surface recombination loss of photo-generated carriers in these lower cost thinned silicon solar cells to significantly improve their efficiency.

SUMMARY

Described herein are photovoltaic solar cells and methods of fabricating same. An embodiment of a photovoltaic solar cell includes a backside semiconductor-oxide-nitride-oxide nonvolatile charge storage structure. The semiconductor-oxide-nitride-oxide nonvolatile charge storage structure includes a surface structure including a front-surface layer and associated front-side contact, a semiconductor bulk layer including semiconductor-based light absorbing material that absorbs photons and generates electrons using a photovoltaic effect, the semiconductor bulk layer including a semiconductor substrate region; and a backside structure contacting the semiconductor substrate region and including a semiconductor-oxide-nitride-oxide charge storage layer structure and a backside contact. The semiconductor-oxide-nitride-oxide charge storage layer structure is programmed electrically to eliminate backside losses due to recombination of photo-generated minority charge carriers created by incident sunlight in said semiconductor substrate region.

An embodiment of a method for manufacturing a semiconductor-oxide-nitride-oxide-oxide-nitride-oxide charge storage layer structure in a semiconductor-based photovoltaic solar cell includes forming a semiconductor-oxide-nitride-oxide charge storage layer stack structure by growing a first oxide layer on a semiconductor substrate, depositing a nitride charge storage layer on the first oxide layer, and depositing a second oxide layer on the nitride charge storage layer, and forming a conductive layer on the second oxide layer of the semiconductor-oxide-nitride-oxide charge storage layer stack structure.

An embodiment of a method for forming a vent window structure in a backside of a photovoltaic solar cell with a semiconductor-oxide-nitride-oxide charge storage layer structure includes forming a semiconductor-oxide-nitride-oxide charge storage layer stack structure by growing a first oxide layer on a semiconductor substrate, depositing a nitride charge storage layer on the first oxide layer, and depositing a second oxide layer on the nitride charge storage layer, forming a grove on the semiconductor-oxide-nitride-oxide charge storage layer stack, the bottom of the groove residing in the semiconductor substrate, forming a conductive layer on the grooved semiconductor-oxide-nitride-oxide charge storage layer stack structure, implanting a p-type material in the grove, and forming a gate electrode and a base electrode.

Another embodiment of a method for forming a vent window structure in a backside of a photovoltaic solar cell with a semiconductor-oxide-nitride-oxide charge storage layer structure includes forming a semiconductor-oxide-nitride-oxide charge storage layer stack structure by growing a first oxide layer on a semiconductor substrate, depositing a nitride charge storage layer on the first oxide layer, and depositing a second oxide layer on the nitride storage layer, forming a conductive layer on the semiconductor-oxide-nitride-oxide charge storage layer stack structure, and forming a gate electrode and a base electrode.

BRIEF DESCRIPTION OF DRAWINGS

The detailed description will refer to the following drawings, wherein like numerals refer to like elements, and wherein.

DETAILED DESCRIPTION

Figure 1:
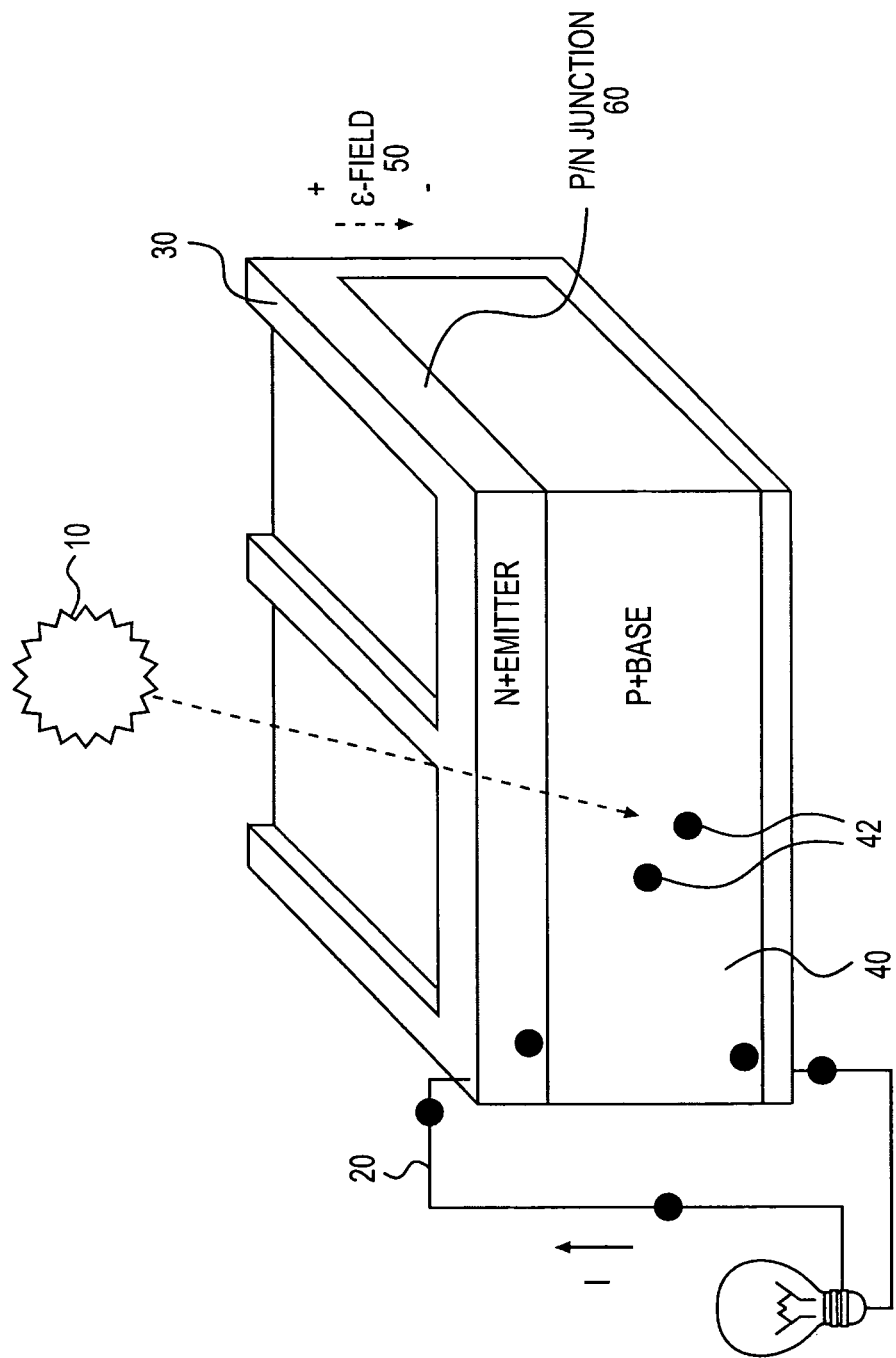
FIG. 1 illustrates the working mechanism of a photovoltaic silicon solar cell.

Embodiments described herein include a method to increase silicon solar cell efficiency through the addition of a new active backside nonvolatile charge storage layer, which when programmed electrically just once, as the last step in the manufacturing process, permanently pins the backside silicon interface in a manner almost identical to the surface pinning technique used in low light level charge coupled device, and photovoltaic solar cells with such features. This pinned backside interface creates an inversion layer to fill traps at the backside silicon-oxide interface with electrons (p-type semiconductor) as well as electro-statically repels photo-generated electrons, effectively eliminating all efficiency losses associated with backside surface recombination of photo-generated minority carrier electrons.

This description is intended to be read in connection with the accompanying drawings, which are to be considered part of the entire written description of this invention. The drawings are not necessarily to scale and certain features of the invention may be shown exaggerated in scale or in somewhat schematic form in the interest of clarity and conciseness. In the description, relative terms such as "front," "back," "up," "down," "top" and "bottom," as well as derivatives thereof, should be construed to refer to the orientation as then described or as shown in the drawing under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

FIG. 1 illustrates the working mechanism of a photovoltaic silicon solar cell 30. The photovoltaic solar cell 30 is a solid-state semiconductor device that directly converts sunlight 10 into electricity. This conversion is referred to as the photovoltaic effect, which is the physical process through which the photovoltaic solar cell 30 converts photons from incident sunlight 10 directly into electricity—with the photon energy (Eph) inversely proportional to the incident sunlight's wavelength ($\lambda$) where Eph=1.24/$\lambda$. Incident light on the photovoltaic solar cell 30 produces both a DC current (I) and voltage (V) that delivers electric power (V×I) to an external load. Under illumination, incident photons are absorbed in the photovoltaic solar cell 30, creating electron-hole pairs 40, which are then separated and collected by an internal electric field 50 created by the semiconductor p/n junction 60. Photo-generated electrons 42 are collected by the contacts at the front of the solar cell 30, i.e., front-side contacts, followed by the movement of these higher energy photo-generated electrons 42 into an external circuit 20, where they dissipate their energy in the external load and return to the photovoltaic solar cell 30 to recombine with the photo-generated holes 40 at the contacts at the backside of the photovoltaic solar cell 30, i.e., backside contacts.

In the photovoltaic process, any photo-generated electrons 42 that internally recombine before arriving at the front-side contacts reduce the sunlight to electricity conversion efficiency. In conventional aluminum-backed silicon solar cells, one of the sources or sites for electron recombination is the silicon-to-aluminum backside contact interface, i.e., surface.

An embodiment of a silicon-based photovoltaic solar cell with a semiconductor-oxide-nitride-oxide, e.g., silicon-oxide-nitride-oxide (SONO), backside structure (referred to as a "PHONOS solar cell") greatly improves solar cell efficiency gains (of at least 20%) by eliminating "backside" losses, i.e., losses due to the recombination of charge carriers created by the incident sunlight 10. The semiconductor of the semiconductor-oxide-nitride-oxide structure may be, for example, silicon, or another suitable semiconductor. The backside structure may be employed in other areas, such as in low-light level cameras to improve sensitivity.

Figure 2:
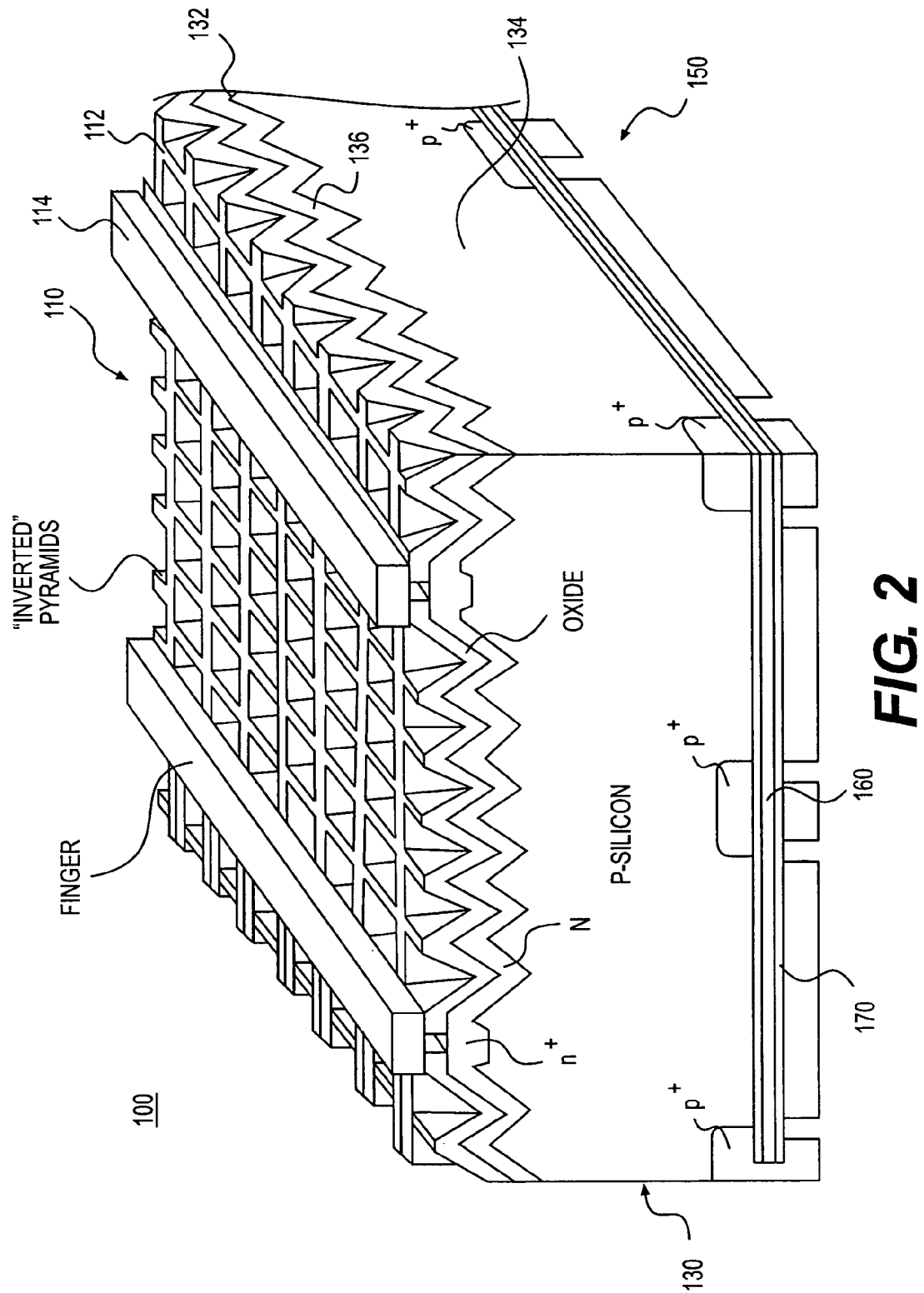
FIG. 2 illustrates an embodiment of a silicon-based photovoltaic solar cell with a semiconductor-oxide-nitride-oxide, e.g., silicon-oxide-nitride-oxide (SONO), backside structure (referred to as a PHONOS solar cell)

FIG. 2 illustrates an embodiment of a PHONOS solar cell 100, e.g., silicon solar cell, utilizing the SONO backside structure. In this embodiment, the solar cell 100 includes a surface structure 110 that contains a semiconductor front surface layer 112 and an associated front-side contact 114, a bulk layer 130, and a backside structure 150 that contains a SONO nonvolatile charge storage structure 160 and a backside contact 170. The first semiconductor front surface structure 110 may also include a protective layer (not shown). The bulk layer 130 may be referred to as the semiconductor bulk layer 130.

The surface layer 112 is a protective layer that typically contains a glass or plastic cover or other encapsulant, an antireflective layer, and an oxide layer, such as $SiO_2$. The front-side contact 114 may be composed of conductive material or a mixture of conductive materials and may have direct contact with the bulk layer 130 to allow electric charges to enter a circuit. In the embodiment shown in FIG. 2, the silicon solar cell 100 includes a plurality of the front-side contacts 114, which are in the form of elongated parallel stripes, referred to as "fingers" in FIG. 2.

The bulk layer 130 may include silicon-based light absorbing material that absorbs photons and generates electrons using the photovoltaic effect. In one embodiment, the light absorbing material typically has the property of preferentially absorbing the wavelengths of solar light that reach the Earth surface. In another embodiment, the silicon-based light absorbing material is optimized for light absorption beyond Earth's atmosphere. Examples of the silicon-based light absorbing material include, but are not limited to, crystalline silicon such as monocrystalline silicon (c-Si), poly- or multicrystalline silicon (poly-Si or mc-Si), and ribbon silicon. The semiconductor material may be, for example, either p-type or n-type and doped at the front surface to be either N+ or P+ respectively. Described herein is a solar cell fabricated on a p-type substrate; however, the techniques described are applicable to a n-type substrate as well. Furthermore, although silicon has been used as the photovoltaic semiconductor medium, those skilled in the art of solar cells will realize other materials, such as compound semiconductors, may be employed as a PHONOS-type solar cell.

In one embodiment, the bulk layer 130 includes a crystalline silicon layer that is doped with an n-type dopant on one side, forming an n-silicon region 132, and is doped with a p-type dopant on the other side, forming a p-silicon region 134. The border between the N+-silicon region 132 and the p-silicon region 134 is referred to as an N+/p junction 136. The N+/p junction 136 is located so the maximum amount of light is absorbed near the N/+p junction 136. The free electrons generated by light deep in the p-region of the silicon solar cell 100 diffuse to the N+/p junction 136 and separate in the electric field of the junction to produce an open-circuit voltage and a short-circuit current. In addition, holes generated in the N+ region, diffuse to the N+/p junction to contribute to the open-circuit voltage and short-circuit current.

The bulk layer 130 may be formed with multiple physical configurations to take advantage of different light absorption and charge separation mechanisms. In one embodiment, the bulk layer 130 has a surface shape of an inverted pyramids array to suppress incident light reflection from the front-side silicon surface.

Figure 3:
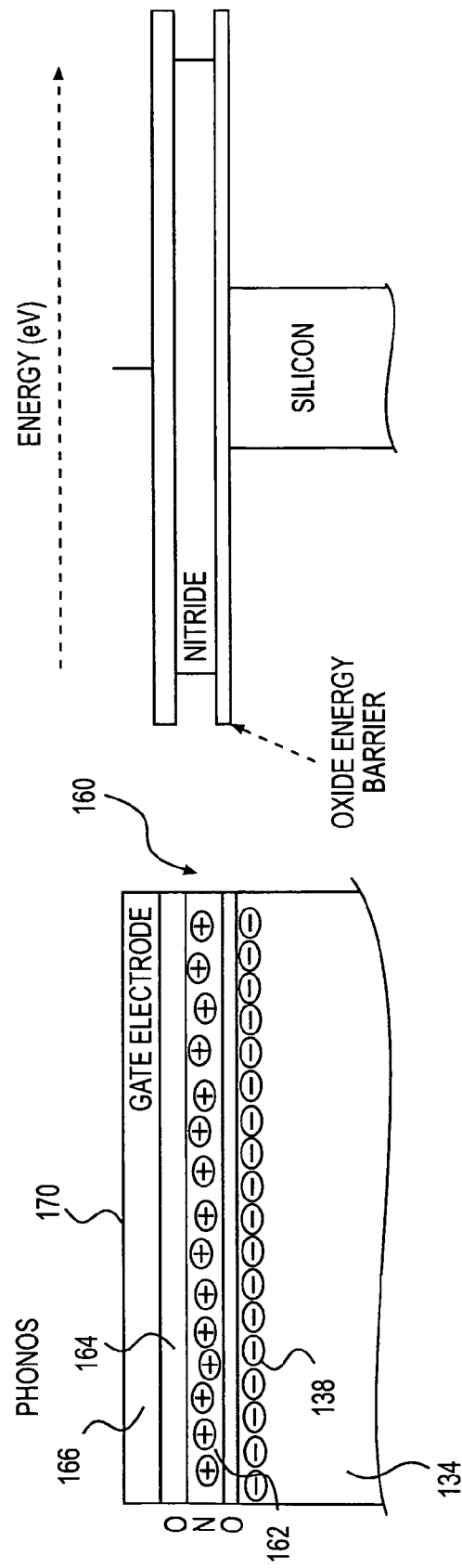
FIG. 3 illustrates an embodiment of the SONO nonvolatile charge storage structure at the backside of the PHONOS solar cell of FIG. 2.

FIG. 3 illustrates an embodiment of the semiconductor-oxide-nitride-oxide, e.g., SONO, nonvolatile charge storage structure 160 of the backside structure 150 of the PHONOS solar cell 100. In one embodiment, the semiconductor-oxide-nitride-oxide nonvolatile charge storage structure 160 includes a first oxide layer 162 that is in contact with the p-silicon region 134 of the bulk layer 130, a second oxide layer 166 that is in contact with the backside contact 170, and a silicon nitride charge storage layer 164 between the first oxide layer 162 and the second oxide layer 166. The silicon nitride charge storage layer 164 may be referred to as the nitride layer 164. The interface between the p-silicon region 134 and the first oxide layer 162 is referred to as a backside silicon interface 138, which may also be referred to as the backside interface 138 or backside surface 138. The backside structure 150 is programmed to pin the backside silicon interface 138 in a manner that is similar to the surface pinning technique used in low light level charge couple devices (CCDs).

Surface pinning is a method for permanently inverting the p-type silicon surface at the backside interface 138 by "pinning" the backside surface 138 to a fixed potential, using CCD technologies described in, for example, J. Hynecek, IEEE Trans. on Electron Devices, ED-28, 483 (1981). The surface generation current on CCDs, as well as photodiode active pixel sensor arrays, may be reduced using a permanently filled surface inversion layer. The presence of free carriers may fill interface states. If these states are permanently filled, electron-hole pair generation and recombination at the surface may be suppressed as well as the trapping of any photo-generated minority carriers. In n-type buried channel CCDs, the array clocks may be biased negatively to invert the n-buried channel and "pin" the surface potential beneath each clock phase to substrate potential. The biasing of the clock phases in this manner may cause the holes from the p+ channel "stops" to move under the clock phases to fill the interface states and to suppress "dark current," or pair generation.

The backside silicon interface 138 is typically doped p-type in most silicon solar cells. An embodiment of the PHONOS solar cell 100 inverts or "pins" the backside interface 138 using electrons instead of holes by applying a positive bias to the backside interface 138 with electrically introduced and controlled positive charge stored in the nonvolatile nitride charge storage layer 164. The effect is that any minority carrier, i.e., electron, recombination at the backside interface 138 in the PHONOS solar cell 100 is eliminated by the pinned interface.

In the PHONOS solar cell 100, the surface pinning is achieved by the incorporation of the passive, electrically programmed, nonvolatile silicon nitride charge storage layer 164 to take the place of an active power supply.

With continuing reference to FIG. 3, the semiconductor-oxide-nitride-oxide nonvolatile charge storage structure 160 includes a oxide-nitride-oxide (ONO) stack directly underneath the backside contact 170 (i.e., the gate electrode), which is used to provide the surface or interface pinning. The first oxide layer 162, which is also referred to as the tunnel oxide layer 162, electrically isolates the nitride charge storage layer 164 from the p-silicon region 134 of the bulk layer 130. Similarly, the second oxide layer 166, which is also referred to as the capping oxide layer 166, electrically isolates the nitride charge storage layer 164 from the conductive backside contact 170.

Figure 4:
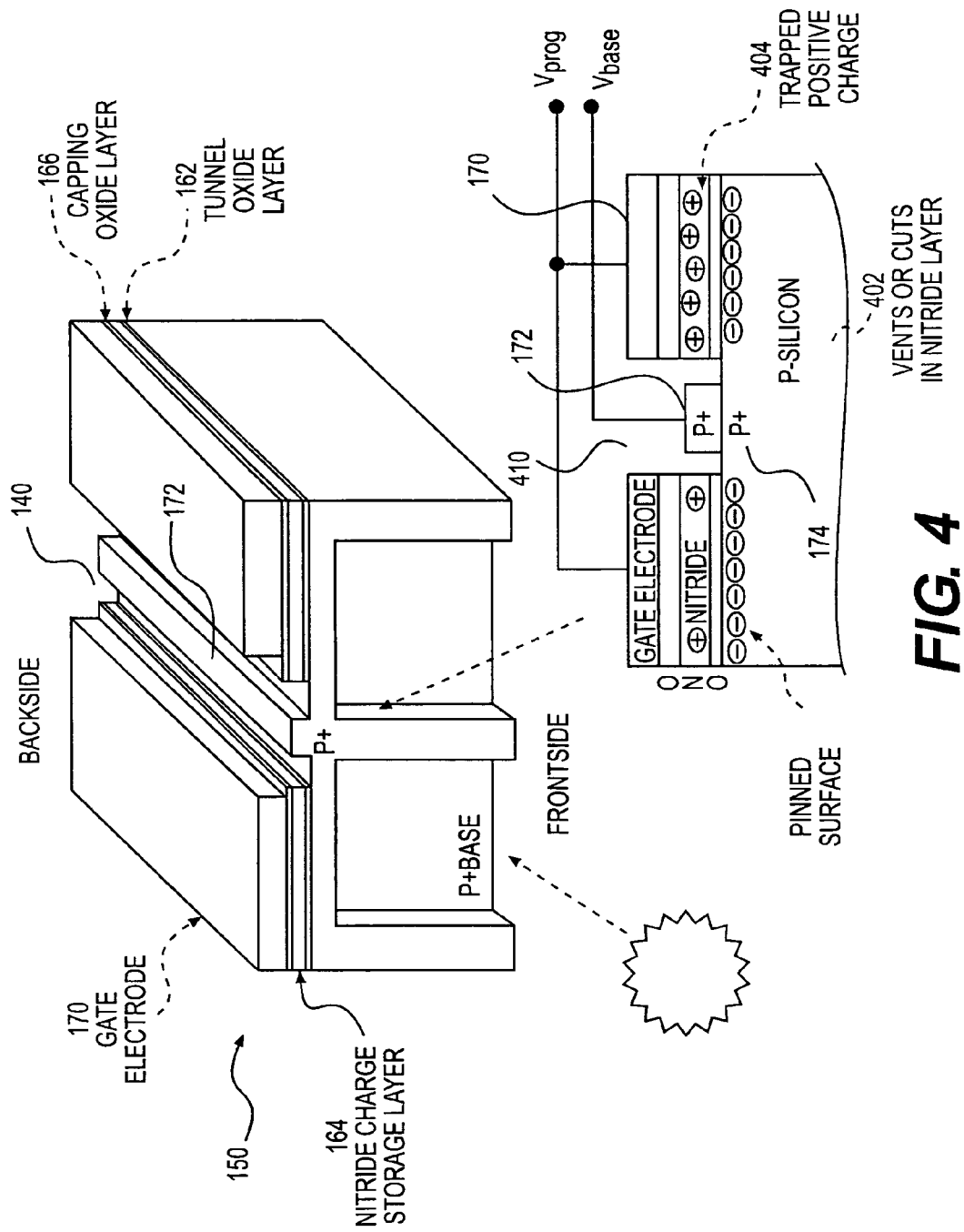
FIG. 4 illustrates an embodiment of a vent window structure in the PHONOS solar cell of FIG. 2.

The backside structure 150 is programmed by applying a large negative bias or programming voltage (V) to the backside contact 170 and grounding a base contact 172 (shown in FIG. 4, also referred to as the base electrode). The base contact 172 is the common electrode that collects photo-generated holes and is electrically connected to the external load as illustrated by FIG. 1. With a large enough electric field supplied by the negative gate bias, positively charged holes are able to quantum-mechanically tunnel from the silicon, through the tunnel oxide layer 162, and into the nitride charge storage layer 164. This tunneling process is described, for example, in the article by Marvin H. White, Dennis A. Adams and Jiankang Bu, "On the Go with SONOS", IEEE Circuits and Devices, Vol. 16, No. 4, July 2000, which is incorporated by reference herein. The programming time is typically less than one second and may be either permanent for the life of the solar cell product or altered at a future date. Accordingly, the PHONOS solar cell 100 may only need to be programmed once during the solar cell or module manufacturing process. The stored positive charges in the nitride charge storage layer 164 provide the needed "permanent" biasing to invert or pin the backside interface 138. The pinned backside interface 138 fill surface states or 'traps' with electrons (e.g., minority carriers) to electrostatically repel photo-generated electrons, thereby effectively eliminating the loss of photo-generated carriers due to backside recombination. An additional benefit of the backside structure 150 is the improved internal reflectivity of the incident light from the backside interface 138 through constructive interference, thereby allowing more of the incident light to be absorbed as the light makes multiple passes through the silicon solar cell 100 in the bulk layer 130.

The thickness of the tunnel oxide layer 162 may be in the range of 10-50 A (Angstroms). In one embodiment, the tunnel oxide layer 162 has a thickness of about 20 A. In another embodiment, the tunnel oxide layer 162 has a thickness of about 30 A. In yet another embodiment, the tunnel oxide layer 162 has a thickness of about 40 A.

The programming voltage may increase with the thickness of the tunnel oxide layer 162 and is typically in the range of 5-50V. In one embodiment, a programming voltage of 7.5V is applied to a PHONOS solar cell with a 20 A tunnel oxide layer 162. In another embodiment, a programming voltage of 20 V is applied to a PHONOS solar cell with a 30 A tunnel oxide layer 162. In yet another embodiment, a programming voltage of 30V is applied to a PHONOS solar cell with a 40 A tunnel oxide layer 162.

The thickness of the capping oxide layer 166 may be less critical and can range from 30 A to 75 A, with 30 A required for the lowest programming voltage and 75 A required for the highest programming voltage. The thickness of the nitride charge storage layer 164 may be in the range of 100-150 A.

The PHONOS solar cell 100 can be constructed to have an excellent charge retention rate, which is a measure of how slowly the stored positive charge "bleeds" or "leaks" out of the nitride charge storage layer due to the gradual de-trapping of stored charges. In the PHONOS solar cell 100, semiconductor-oxide-nitride-oxide, e.g., SONO, charge losses are strongly affected by the thickness of the tunnel oxide layer 162 and the capping oxide layer 166. There are little or no constraints related to the maximum voltage that can be applied to the PHONOS solar cell 100. As a result, the semiconductor-oxide-nitride-oxide, e.g., SONO, structure in the PHONOS solar cell 100 allows the use of tunnel oxides layers 162 and capping oxides layers 166 thicker than those typically used on nonvolatile memories to further reduce the charge loss rate for the backside nonvolatile charge storage structure 160. For example, PHONOS memory charge retention may be extended to well beyond 100 years at +125° C. by increasing the thickness of the tunnel oxide layer 162 from a value of 20 A to 30 A or even 40 A, along with a corresponding increase in the programming voltage from 7.5 V to 20 V or even to 30 V, respectively.

FIG. 4 illustrates an embodiment of a vent window structure of the backside structure 150 of the PHONOS solar cell 100. The vent window structure facilitates hydrogen diffusion during the manufacturing process of the PHONOS solar cell 100 by trapping positive charges 404 in the nitride charge storage layer 164. An embodiment of the vent window structure comprises an etched slot or cut 402 in the backside nitride charge storage layer 164, forming a vent hole or window 410 for the hydrogen diffusion during a final annealing/sintering step, i.e., diffusion. The nitride charge storage layer 164 may be an effective barrier to the diffusion of hydrogen employed in the final annealing/sintering step and may be used to tie up remaining surface states or 'traps'. In some applications, such as low light level CCDs, the nitride layer used for the CCD gate dielectric may need to be perforated with periodic vent holes to allow hydrogen to saturate the entire top surface or interface between the gate dielectric and the silicon light absorbing layer during the final annealing/sintering step.

Alternatively, hydrogen can move laterally along the surface through openings in the nitride layer and help passivate the backside interface.

For the PHONOS solar cell 100, the vent hole or window 410 in the nitride charge storage layer 164 may be located on the backside of the silicon bulk layer 130. The backside structure 150 may also include a base contact 172 and a p+ region 174, which may be located at the bottom of the vent hole or window 410. For purposes of illustration, only one vent hole 410, one base contact 172 and one p+ region 174 are shown. The PHONOS solar cell 100 may include a plurality of vent holes 410, a plurality of base contacts 172 and a plurality of p+ regions (see, e.g., backside structure 150 in FIG. 2). In one embodiment, the base contacts 172 are spaced about 100 um apart from each other. In another embodiment, the base contacts 172 are configured in an interdigitated pattern similar to two interlocked combs.

Figure 5:
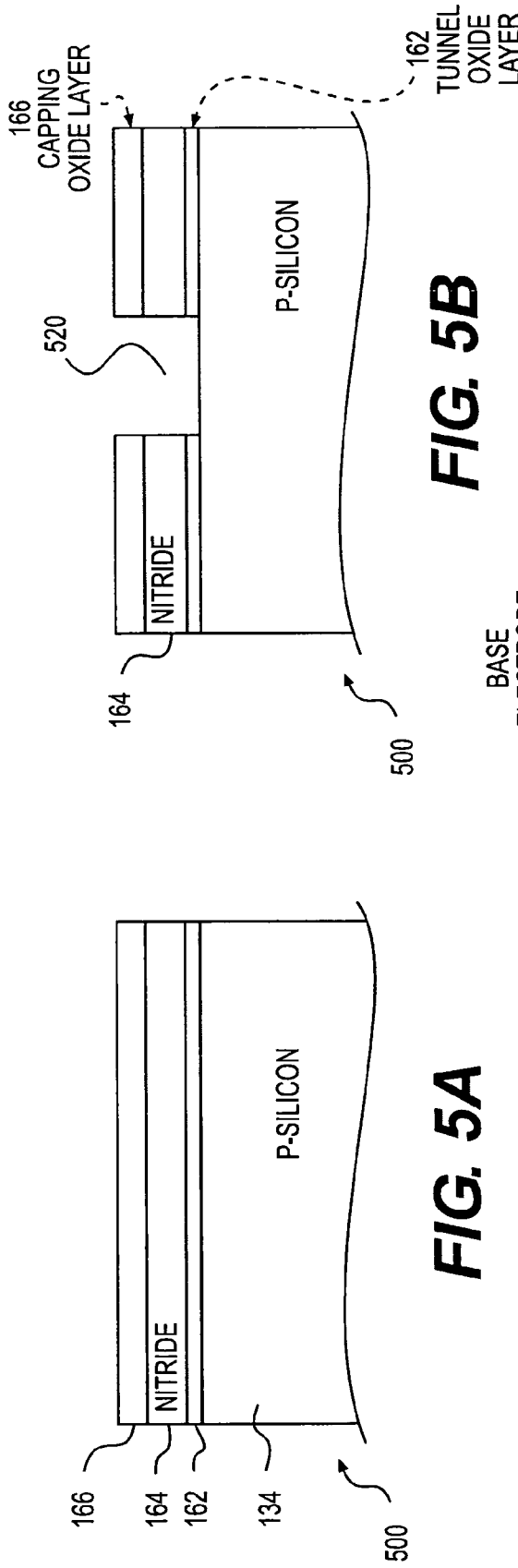
FIGS. 5A, 5B and 5C illustrate an embodiment of a method for producing the SONOS structure at the backside of the PHONOS solar cell of FIG. 2.

FIGS. 5A-5C illustrate an embodiment of a method for manufacturing an embodiment of the SONO backside structure 150 in a PHONOS solar cell 100. The tunnel oxide layer 162 may be thermally grown, followed by, e.g., a chemical vapor deposition ("CVD") of the nitride charge storage layer 164, and the, e.g., thermal oxidation of the nitride charge storage layer 164 to form the capping oxide layer 166 on p-silicon region 134, which is part of the bulk layer 130 of the PHONOS solar cell 100, forming a layer stack 500 (as shown in FIG. 5A). Methods of thermal oxidation of silicon to form the tunnel oxide layer 162, CVD deposition of nitride, and thermal oxidation of nitride to form the capping layer 166 are well known semiconductor processes. Background and descriptions of these process steps can be found in *Silicon Processing for the VLSI Era*, by Wolf, Volumes 1 through 4, which are incorporated by reference herein.

With continuing reference to FIGS. 5A-5C, the layer stack 500 may be, e.g., then patterned with a mask and etched through the tunnel oxide layer 162, the nitride charge storage layer 164, and the capping oxide layer 166 to create groves 520 in the p-silicon region 134. A p+ material may be implanted into the groves 520 to form the p+ regions 174, implants (as shown in FIG. 5B). The p+ material may have a p-type dopant concentration that may be higher than the p-type dopant concentration in the p-silicon region 134. In one embodiment, the p-silicon region 134 has a p-type dopant concentration of $10^{14}$-$10^{16}$ atoms/cm$^3$, and the p+ material has a p-type dopant concentration of $10^{16}$-$10^{19}$ atoms/cm$^3$. A layer of conductive material, such as metal or alloy, may be deposited on top of the capping oxide layer 166. The conductive layer may be patterned with a mask, etched, and sintered to form low resistance backside contacts 170 (i.e., gate electrodes) and the base contacts 172 (i.e., base electrodes) (as shown in FIG. 5C).

In another embodiment, a conductive layer is formed on the layer stack 500 by silk screening, i.e., forming a layer on the top of the capping oxide layer 166 by passing through the mesh of a silk or organic screen having pervious printing areas and impervious nonprinting areas. The backside contacts 170, the base contacts 172 and the p+ regions 174 may be formed by laser fired contacts (LFC) techniques.

Figure 6:
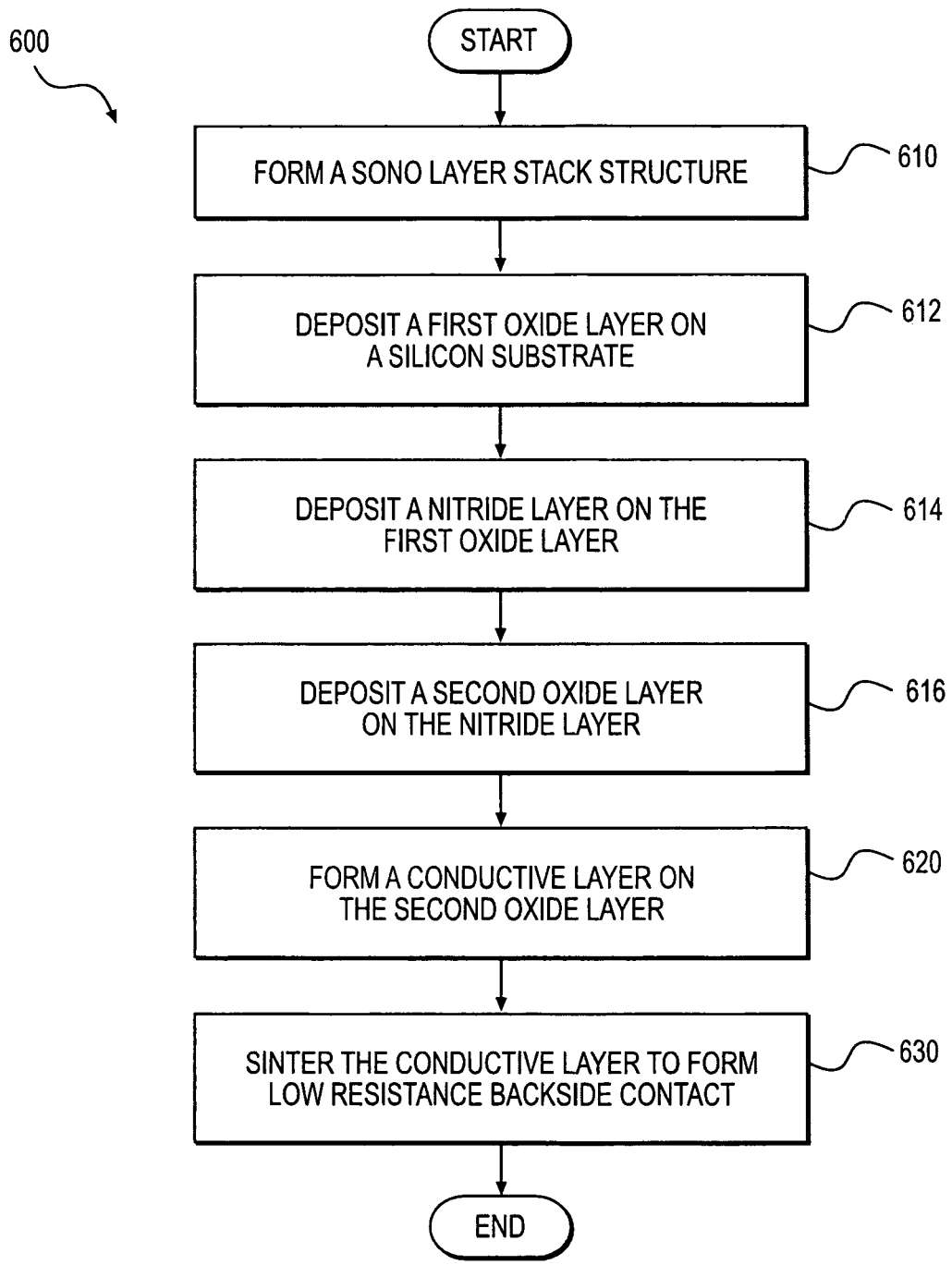
FIG. 6 is a flow chart illustrating an embodiment of a method for manufacturing the SONO structure in the PHONOS solar cell of FIG. 2.

FIG. 6 is a flow chart illustrating an embodiment of a method 600 for manufacturing an embodiment of the semiconductor-oxide-nitride-oxide, e.g., SONO, charge storage layer structure 160 of a PHONOS solar cell 100. The method 600 forms a semiconductor-oxide-nitride-oxide, e.g., SONO, layer stack structure (block 610), which may be accomplished, e.g., by thermally growing a first oxide layer on a silicon substrate (block 612), depositing a nitride charge storage layer on the first oxide layer (block 614), and then forming a second oxide layer by, e.g., either thermally oxidizing the nitride charge storage layer or directly depositing the capping oxide layer (block 616). The method 600 may further include forming a conductive layer on the second oxide layer of the semiconductor-oxide-nitride-oxide layer stack (block 620). The method 600 may also include sintering the conductive layer to form low resistance backside contact (block 630).

Figure 7:
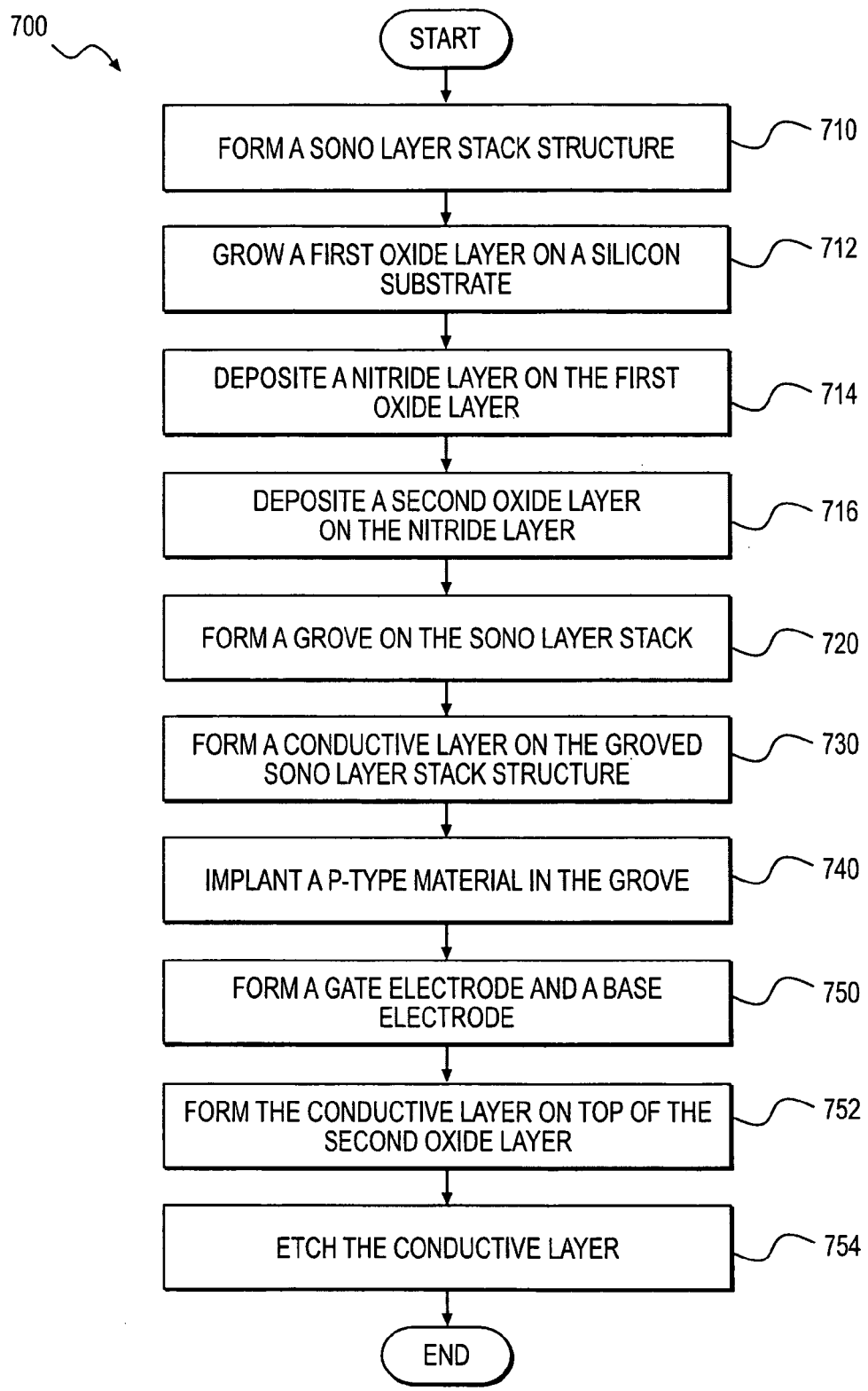
FIGS. 7 and 8 are flow charts illustrating embodiments of a method for forming the vent window structure on the backside of the PHONOS solar cell of FIG. 2.

FIG. 7 is a flow chart illustrating an embodiment of a method 700 for forming the vent window structure of an embodiment of the backside structure 150 of the PHONOS solar cell 100. The method 700 forms a semiconductor-oxide-nitride-oxide, e.g., SONO, layer stack structure (block 710), which may be accomplished by growing a first oxide layer on a silicon substrate (block 712), depositing a nitride charge storage layer on the first oxide layer (block 714), and depositing a second oxide layer on the nitride charge storage layer (block 716). The embodiment 700 may further include forming a grove on the semiconductor-oxide-nitride-oxide layer stack (block 720). The bottom of the groove may reside in the silicon substrate. The embodiment 700 further includes forming a conductive layer on the groved semiconductor-oxide-nitride-oxide layer stack structure (block 730), implanting a p-type material in the grove (block 740), and forming a gate electrode and a base electrode (block 750). The gate electrode and the base electrode may be formed by forming the conductive layer on top of the second oxide layer (block 752), and etching the conductive layer (block 754).

Figure 8:
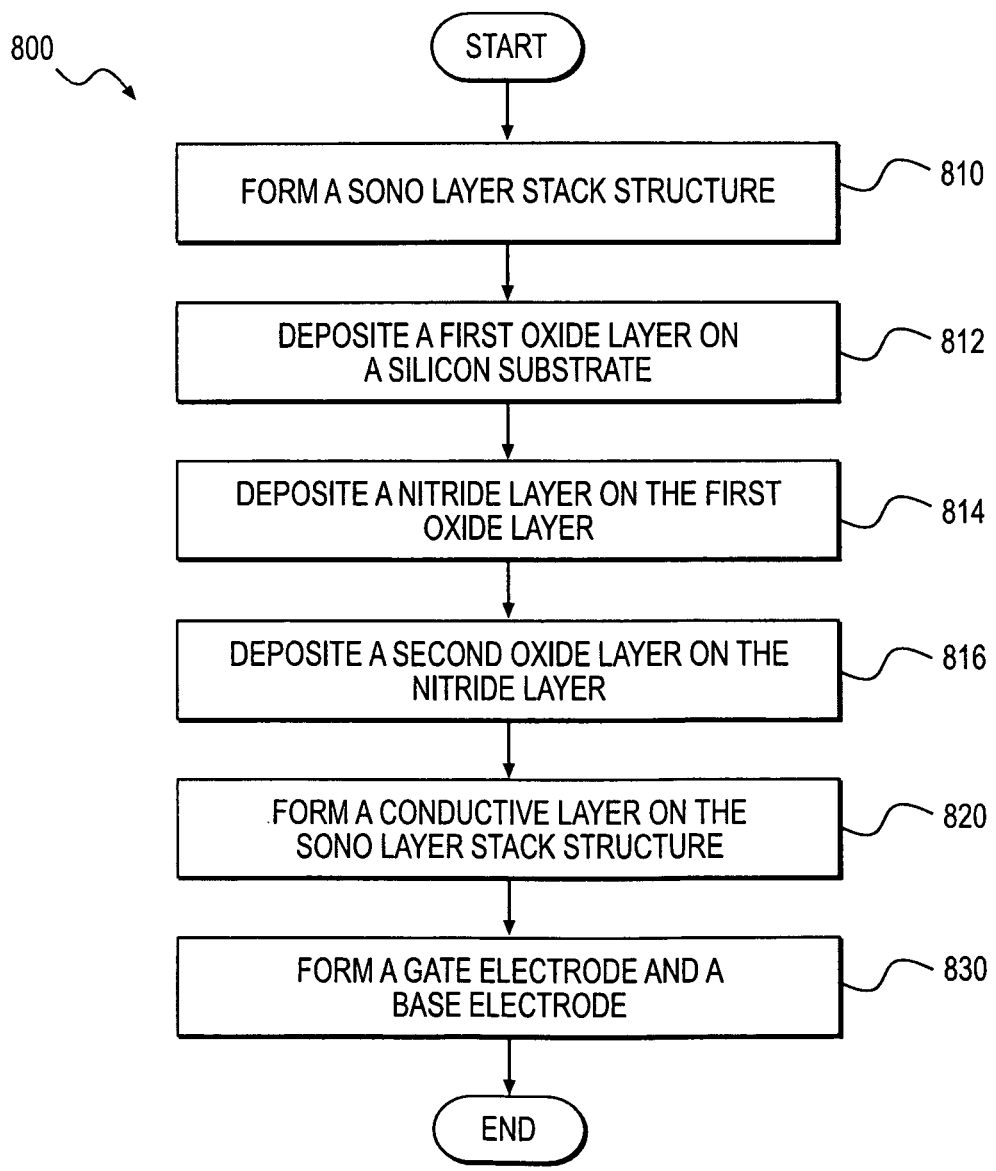

FIG. 8 is a flow chart illustrating another embodiment of a method 800 for forming the vent window structure 410 in the backside of the PHONOS solar cell 100. The method 800 forms a semiconductor-oxide-nitride-oxide, e.g., SONO, charge storage layer stack structure (block 810), which may be accomplished, e.g., by thermally growing a first oxide layer on a silicon substrate (block 812), depositing a nitride charge storage layer on the first oxide layer (block 814), and depositing or thermally growing a second oxide layer on the nitride charge storage layer (block 816). The embodiment 800 further includes forming a conductive layer on the semiconductor-oxide-nitride-oxide layer stack structure (block 820), and forming a gate electrode and a base electrode (block 830). The gate electrode and the base electrode may be formed by laser fired contacts techniques.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A photovoltaic solar cell with a backside semiconductor-oxide-nitride-oxide nonvolatile charge storage structure, comprising:
   a surface structure including a semiconductor front-surface layer and associated front-side contact;
   a semiconductor bulk layer including semiconductor-based light absorbing material that absorbs photons and generates electrons using a photovoltaic effect, wherein the semiconductor bulk layer comprises a semiconductor substrate region; and
   a backside structure contacting the semiconductor substrate region and including a semiconductor-oxide-nitride-oxide charge storage layer structure and a backside contact, wherein the semiconductor-oxide-nitride-oxide charge storage layer structure is programmed electrically to eliminate backside losses due to recombination of photo-generated minority charge carriers created by incident sunlight in said semiconductor substrate region.

2. The photovoltaic solar cell of claim 1, wherein the backside semiconductor-oxide-nitride-oxide nonvolatile charge storage structure further comprises:
  a first oxide layer in contact with the semiconductor substrate region of the semiconductor bulk layer;
  a second oxide layer in contact with an overlying conducting and reflecting layer
  a silicon nitride charge storage layer between the first oxide layer and a second oxide layer, wherein the silicon nitride charge storage layer is charged by a programming voltage by carriers from semiconductor substrate region, wherein carriers are supplied from a backside semiconductor interface formed between the semiconductor substrate region and the first oxide layer.

3. The photovoltaic solar cell of claim 1, where the semiconductor front-surface layer and semiconductor substrate region are comprised of a silicon semiconductor.

4. The photovoltaic solar cell of claim 3, where the semiconductor front-surface layer and semiconductor substrate region are N and P-type, respectively.

5. The photovoltaic solar cell of claim 2, wherein the semiconductor-oxide-nitride-oxide nonvolatile charge storage layer structure comprises a base contact to the semiconductor substrate region, and wherein the backside semiconductor-oxide-nitride-oxide nonvolatile charge storage structure is programmed to pin the backside semiconductor interface by applying a large negative bias to the backside contact, and grounding the base contact.

6. The photovoltaic solar cell of claim 5, wherein the backside semiconductor-oxide-nitride-oxide nonvolatile charge storage structure further comprises an oxide-nitride-oxide (ONO) stack directly underneath the backside contact, wherein the ONO stack stores charges used to pin the backside semiconductor interface.

7. The photovoltaic solar cell of claim 5, wherein the first oxide layer electrically isolates the silicon nitride charge storage layer from the p-silicon region of the silicon bulk layer, and wherein the second oxide layer electrically isolates the nitride charge storage layer from the backside contact.

8. The photovoltaic solar cell of claim 5, wherein the semiconductor-oxide-nitride-oxide nonvolatile charge storage layer structure is programmed once during manufacturing, and wherein stored positive charges in the nitride charge storage layer provide permanent biasing to pin the backside silicon interface, and wherein the pinned backside interface fills surface states with electrons and electrostatically repels photo-generated electrons, thereby effectively eliminating losses of photo-generated carriers due to backside recombination.

9. The photovoltaic solar cell of claim 5, wherein the first tunnel oxide layer has a thickness in the range of 10-50 Angstroms.

10. The photovoltaic solar cell of claim 9, wherein the programming voltage increases with the thickness of the first oxide layer and is in the range of 5-50 Volt.

11. The photovoltaic solar cell of claim 2, wherein the second oxide layer has a thickness in the range of 30-75 Angstroms, and wherein the nitride charge storage layer has a thickness in the range of 100-150 Angstroms.

12. The photovoltaic solar cell of claim 1, wherein the semiconductor-oxide nitride-oxide nonvolatile charge storage layer structure allows more of the incident light to be absorbed as the incident light makes multiple passes through the photovoltaic solar cell in the semiconductor substrate region.

13. The photovoltaic solar cell of claim 1, wherein the surface layer comprises:
  a glass or plastic cover;
  an antireflective layer; and
  an oxide layer.

14. The photovoltaic solar cell of claim 1, wherein the front-side contact includes conductive material or a mixture of conductive materials, and wherein the front-side contact has direct contact with the semiconductor substrate region to allow electric charges to enter a circuit.

15. The photovoltaic solar cell of claim 1, wherein surface layer comprises a plurality of the front-side contacts in the form of elongated parallel stripes.

16. The photovoltaic solar cell of claim 1, wherein the semiconductor-based light absorbing materials absorbs the wavelengths of solar light that reach the Earth surface.

17. The photovoltaic solar cell of claim 1, wherein the semiconductor-based light absorbing materials are optimized for light absorption beyond the Earth's atmosphere.

18. The photovoltaic solar cell of claim 5, wherein the semiconductor-based light absorbing material is a crystalline silicon selected from a group consisting of monocrystalline silicon (c-Si), poly- or multicrystalline silicon (poly-Si or mc-Si), and ribbon silicon, and wherein the silicon-based light absorbing material is doped with an n-type or p-type dopant.

19. The photovoltaic solar cell of claim 5, wherein the silicon bulk layer comprises a crystalline silicon layer, wherein the crystalline silicon layer is doped with an n-type dopant on one side, forming the n-silicon region, and is doped with a p-type dopant on another side, forming the p-silicon region, wherein a p/n junction is formed at a border between the n-silicon region and the p-silicon region, wherein a maximum amount of light is absorbed near the p/n junction, and wherein free electrons and holes generated by light deep in the photovoltaic solar cell diffuse to the p/n junction, then separate to produce an electric current.

20. The photovoltaic solar cell of claim 1, wherein the semiconductor front-surface layer and semiconductor substrate region are formed with multiple physical configurations to take advantage of different light absorption and charge separation mechanisms.

21. The photovoltaic solar cell of claim 20, wherein the semiconductor substrate region has a surface shape of an inverted pyramids array to suppress incident light reflection from a front-side silicon surface.

22. The photovoltaic solar cell of claim 1, wherein the surface structure further comprises a protective layer.

23. The photovoltaic solar cell of claim 5, wherein the semiconductor-oxide-nitride-oxide nonvolatile charge storage layer structure further comprises a vent window structure to facilitate hydrogen diffusion during manufacturing of the photovoltaic solar cell.

24. The photovoltaic solar cell of claim 22, wherein the semiconductor-oxide-nitride-oxide nonvolatile charge storage layer structure comprises a base contact and a p+ region.

25. The photovoltaic solar cell of claim 24, wherein the base contact and the p+region are located at a bottom of the vent window structure, and wherein the backside contact, the base contact and the p+ region are formed by laser fired contacts (LFC) techniques.

26. The photovoltaic solar cell of claim 24, wherein the p+ region has p+ material with a p-type dopant concentration higher than that of a p-silicon region of the silicon bulk layer, wherein the p-silicon region has a p-type dopant concentration of $10^{14}$-$10^{16}$ atoms/cm$^3$, and wherein the p+ material has a p-type dopant concentration of $10^{16}$-$10^{19}$ atoms/cm$^3$.

27. The photovoltaic solar cell of claim 24, wherein the vent window structure comprises a plurality of vent holes, wherein the semiconductor-oxide-nitride-oxide nonvolatile charge storage layer structure comprises a plurality of base contacts configured in an interdigitated pattern similar to two interlocked combs.

\* \* \* \* \*